United States Patent [19]

Mochizuki et al.

[11] Patent Number: 5,595,856
[45] Date of Patent: Jan. 21, 1997

[54] HEAT-RESISTANT PHOTORESIST COMPOSITION AND NEGATIVE-TYPE PATTERN FORMATION METHOD

[75] Inventors: Amane Mochizuki; Michie Ishii; Masako Maeda; Kazumi Higashi, all of Osaka, Japan

[73] Assignee: Nitto Denko Corporation, Osaka, Japan

[21] Appl. No.: 594,720

[22] Filed: Jan. 31, 1996

[30] Foreign Application Priority Data

Feb. 14, 1995 [JP] Japan .................................. 7-025132

[51] Int. Cl.$^6$ .................................................. G03F 7/038
[52] U.S. Cl. .......................................................... 430/270.1
[58] Field of Search ............................................ 430/270.1

[56] References Cited

U.S. PATENT DOCUMENTS

| | | | |
|---|---|---|---|
| 4,456,679 | 6/1984 | Leyrer et al. | 430/270.1 |
| 4,465,760 | 8/1984 | Leyrer et al. | 430/325 |
| 4,565,771 | 1/1986 | Lynch et al. | 430/270.1 |
| 5,087,547 | 2/1992 | Taylor et al. | 430/169 |
| 5,240,811 | 8/1993 | Taylor et al. | 430/270.1 |

FOREIGN PATENT DOCUMENTS 6-43652A2  2/1994  Japan ................................. 430/270.1

OTHER PUBLICATIONS

Kumada et al Apr. 20, 1993.

*Primary Examiner*—Cynthia Hamilton
*Attorney, Agent, or Firm*—Sughrue, Mion, Zinn, Macpeak & Seas

[57] ABSTRACT

A heat-resistant negative-working photoresist composition comprising a resin component having a carbodiimide unit in the molecule, and a compound capable of inducing a basic compound by irradiation with actinic rays. The photosensitive layer formed by the photoresist composition shows a sufficient sensitivity even by a lower irradiation energy and can give a sharp negative-type pattern by irradiation with actinic rays such as ultraviolet rays.

7 Claims, No Drawings

HEAT-RESISTANT PHOTORESIST COMPOSITION AND NEGATIVE-TYPE PATTERN FORMATION METHOD

FIELD OF THE INVENTION

The present invention relates to a heat-resistant photoresist composition and a method of forming a negative-type pattern.

BACKGROUND OF THE INVENTION

Hitherto, from the points of mechanical strength and heat-resistant characteristics, a photoresist using a polyimide or a polyimide precursor has been practically used as a heat-resistant photoresist, and in particular, a negative-working photoresist forming desired relief images on various kinds of substrates by reducing solubility of the polyimide or polyimide precursor to a developer by irradiation of actinic rays has been mainly used.

Such heat-resistant photoresists each using negative-working photosensitive polyimide or the precursor thereof, which leave portions irradiated with actinic rays on each substrate, and the uses thereof are much proposed. For example, there are proposed (1) a method of introducing a methacryloyl group into a polyimideprecursor via an ester bond or an ionic bond as described in JP-A-49-11541, JP-A-50-40992, JP-A-54-145794, JP-A-56-38038, etc., ("JP-A" as used herein means an "unexamined published Japanese patent application"), (2) a method of using a soluble polyimide having a photopolymerizing olefin as described in JP-A-59-108031, JP-A-59-220730, JP-A-59-232122, JP-A-60-6729, JP-A-60-72925, JP-A-61-57620, etc., and (3) a method of using a self-sensitizing type polyimide having a benzophenone skeleton and having an alkyl group at the ortho-position of the aromatic ring having bonded thereto a nitrogen atom as described in JP-A-59-219330, JP-A-59-231533, etc.

However, in the conventional negative-working photoresists using the above-described photosensitive polyimide or polyimide precursor, there is a problem in the function and the resolving power thereof and further, according to the uses thereof, there is a problem that the yield for the negative-working photoresist at the production thereof is lowered, etc. For example, in the heat-resistant photoresists produced in the method (1) described above, in the case of the ester bond-type photoresist, the synthesis is difficult, and in the case of the ionic bond-type photoresist, shrinkage occurs at imidation (heat curing). Also, in these heat-resistant photoresists, the thickness of the film or the layer of the photoresist is reduced at development, and the thickness of the residual film or layer after development and heat curing becomes about 50% of the initial thickness of the film or the layer. That is, there is a problem in the dimensional stability in these heat-resistant photoresists. Moreover, in the heat-resistant photoresists produced by the methods (2) and (3) described above, since the structure of the skeleton of the polymer used is limited, the properties of the coated layer or film finally obtained, whereby these photoresists cannot flexibly correspond to various required characteristics.

Further, since these photosensitive polyimides and polyimides precursors are insufficient in the point of light transmittance and, in particular, the light transmission factor in the film thickness direction is insufficient, several hundreds of mJ/cm$^2$ are required as the amount of ultraviolet rays irradiating for forming patterns. As a result, the exposure time is prolonged and thus they have yet a problem in the point of productivity.

On the other hand, polycarbodiimide having a carbodiimide unit in the molecule is known as a resin excellent in heat resistance obtained by decarboxylation polycondensation of an isocyanate compound. By heating the resin, the carbodiimide bond in the molecule thereof causes a crosslinking reaction to improve the heat resistance of the resin.

Recently, a photosensitive composition obtained by compounding such a polycarbodiimide with an aromatic azide compound is proposed as described in JP-A-6-211956. However, this composition has the disadvantages that the composition is yet insufficient in the point of sensitivity, at the irradiation of the aromatic bisazide compound with light it is necessary to sufficiently consider the influence of oxygen, and thus, in the case of using the composition, the system is liable to be restricted in the apparatus. That is, since when a large amount of oxygen exists in the atmosphere at the light irradiation, nitrene formed by the light irradiation of the bisazide compound does not react with the polymer but preferentially reacts with oxygen to greatly lower the sensitivity of the composition, a deaerator becomes necessary at the light irradiation. Also, the coated film formed from the photosensitive composition compounded with an aromatic bisazide compound is greatly colored, and therefore it is difficult to use such a photosensitive composition in the field of requiring a transparency, such as a photosemiconductor device, LCD, etc. Further, there are the faults that the mechanism of the curing reaction is complicated, and the coated film becomes brittle and is poor in flexibility after the light irradiation.

SUMMARY OF THE INVENTION

Accordingly, one object of the present invention is to overcome the above-described problems caused by conventional negative-working photoresists and to provide a heat-resistant photoresist composition having a high sensitivity and a good resolving power and sufficiently capable of enduring practical use.

Another object of the present invention is to provide a method of forming a negative-type pattern by irradiating a photosensitive layer formed with the heat-resistant composition with actinic rays via a photomask followed by development.

As a result of various investigations on a novel heat-resistant photoresist composition capable of attaining the objects described above, it has been found that a photoresist composition using polycarbodiimide as the skeletal component of the photoresist and compounding therewith a carbamate derivative as a compound (photodecomposable base generator) capable of inducing a basic compound by the irradiation of actinic rays has excellent sensitivity and resolving power and forms a negative-working relief image showing less reduction in the thickness of the coated layer thereof. The present invention has been completed based on this finding.

According to one embodiment of the present invention, there is provided a heat-resistant photoresist composition comprising a resin component having a carbodiimide unit represented by the following formula (I) in the molecule, and a compound capable of inducing a basic compound by the irradiation of actinic rays.

$$-\!\!+\!\!R\!-\!N\!=\!C\!=\!N\!\!+\!\!- \qquad (I)$$

wherein R represents a divalent organic group.

According to another embodiment of the present invention, there is provided a method of forming a negative-type pattern, which comprises irradiating a photosensitive layer formed using the heat-resistant photoresist composition with actinic rays via a photomask, applying thereto a heat treatment, and removing unexposed portions with a developer.

DETAILED DESCRIPTION OF THE INVENTION

The present invention is described in detail below.

The resin component used in the heat-resistant photoresist composition of the present invention is a compound having a carbodiimide unit represented by the formula (I) described above in the molecule, that is, a polycarbodiimide compound, which becomes the skeletal material of a resist film formed. Conventional methods can be used as a method of synthesizing such a polycarbodiimide. For example, the polycarbodiimide can easily be synthesized by reacting organic polyisocyanates each other in an organic solvent in the presence of a carbodiimidation catalyst as described in, for example, T. W. Campbell et al., *Journal of Organic Chemistry*, 28, 2069(1963), L. M. Alberino et al, *Journal of Applied Polymer Science*, 12, 1999(1977), JP-A-2-292316, and JP-A-4-275359.

Examples of the organic polyisocyanate which can be used in the synthesis of the polycarbodiimide include 2,4-tolylene diisocyanate, 2,6-tolylene diisocyanate, 1-methoxyphenyl-2,4-diisocyanate, 4,4'-diphenylmethane diisocyanate, 3,3'-dimethoxy-4,4'-diphenylmethane diisocynate, 3,3'-dimethyl-4,4'-diphenylmethane diisocyanate, 4,4'-diphenyl ether diisocyanate, 3,3'-dimethyl-4,4'diphenylether diisocyanate, and o-tolylene diisocyanate. Those compounds can be used alone or as mixtures of two or more thereof (a copolymer is obtained).

Examples of the organic solvent which can be used include halogenated hydrocarbons such as tetrachloroethylene, 1,2-dichloroethane, chloroform, etc.; ketones such as acetone, methyl ethyl ketone, methyl isobutyl ketone, cyclohexanone, etc.; and cyclic ethers such as tetrahydrofuran, dioxane, etc. Those can be used alone or as mixtures thereof.

Examples of the carbodiimidation catalyst which can be used include phosphorene oxides such as 3-methyl-1-phenylphosphorene-1-oxide, 1-phenyl-2-phosphorene-1-oxide, 1-ethyl-2-phosphorene-1-oxide, etc., and the 3-phosphorene isomers of them. Those can be used alone or as mixtures thereof.

The molecular weight of the polycarbodiimide used in the present invention can be controlled by blocking the chain thereof by introducing a monoisocyanate to the terminal thereof. The preferred molecular weight of the polycarbodiimide in the present invention is from about 300 to 300,000, and preferably from about 2,000 to 50,000, as a number average molecular weight (GPC (gas permeation chromatography) method, converted as polystyrene). If the number average molecular weight thereof is less than 300, there is a possibility that the mechanical strength of the coated film finally obtained becomes low. On the other hand, if the number average molecular weight is over 300,000, there is a possibility that the storage stability thereof in a solution state becomes poor.

The polycarbodiimide used in the present invention may contain other structural unit such as an amic acid unit, an imide unit, an amidoimide unit, a siloxane unit, etc., so long as the polycarbodiimide has the carbodiimide unit represented by the formula (I) described above in the molecule.

The content of the carbodiimide unit in the resin component is from 20 to 100 mol %, and preferably from 50 to 95 mol %. If the content of the unit is less than 20 mol %, the resolving power of the negative-type pattern formed is undesirably reduced.

The heat-resistant photoresist composition of the present invention contains a compound capable of inducing a basic compound by irradiating the resin component with actinic rays as an essential component. Such a compound has a property that when the compound is irradiated with actinic rays such as ultraviolet rays, the hydrogen atom is pulled out from the molecule of the compound to liberate a basic material such as an amine, and is generally called "photo-base generator", "photodecomposable base generator", "amine photo-generator", etc. Practically, as the compound it is preferred to use a carbamate derivative represented by the following formula (II) and/or a carbamate derivative represented by the following formula (III).

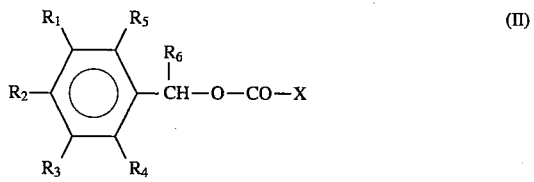

wherein $R_1$, $R_2$, and $R_3$ each represent a hydrogen atom or a methoxy group; $R_4$ and $R_5$ each represent a hydrogen atom or a nitro group, and at least one of $R_4$ and $R_5$ shows a nitro group; $R_6$ represents a hydrogen atom or a lower alkyl group having from 1 to 6 carbon atoms; and X represents a monovalent amine residue for carbamate bonding.

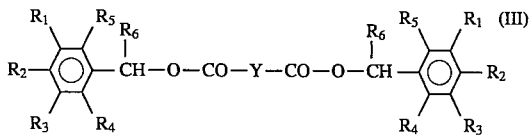

wherein $R_1$, $R_2$, and $R_3$ each represent a hydrogen atom or a methoxy group; $R_4$ and $R_5$ each represent a hydrogen atom or a nitro group, and at least one of $R_4$ and $R_5$ shows a nitro group; $R_6$ represents a hydrogen atom or a lower alkyl group having from 1 to 6 carbon atoms; and Y represents a divalent amine residue for dicarbamate bonding.

In the present invention, when the photosensitive layer formed from the photoresist composition containing the above-described resin component and the above-described compound capable of inducing a basic compound by irradiation with actinic rays as the essential components is irradiated with actinic rays, the solubility of the exposed portions of the resin component to a developer is lowered as compared with the solubility thereof before the irradiation, whereby a desired negative-type pattern can be obtained.

The reason thereof has not yet been clarified, but it is considered that the carbamate derivative forms free primary amine or secondary amine by irradiation with actinic rays and the amine thus formed acts on the carbodiimide unit in the resin component to induce a crosslinking reaction, whereby the solubility of the resin component to the developer is lowered. Practically, a nucleophilic addition reaction, etc., of amine occurs at the carbon of the carbodiimide, and in the induction of the crosslinking reaction, an amine addition product of the carbodiimide unit, such as guanidine derivatives, urea derivatives, etc., is formed. It is also considered that the addition product catalytically functions to further synergistically and chainlike accelerate the crosslinking reaction. Further, for more accelerating such a crosslinking reaction accompanied by the change of solubility, it is preferred to carry out a heat treatment at the temperature of from 50° to 300° C., and preferably from 100° to 170° C., for about 5 to 30 minutes after exposure (before development). If the heat treatment is carried out at a temperature over 300° C., there are undesirable possibilities that the carbamate derivative is thermally decomposed, the carbodiimide bonds in the resin component are crosslinked and cured by forming a dimer or a trimer to greatly prolong the development time, and also the contrast (resolving power) of the pattern obtained is lowered.

When at least one of $R_1$, $R_2$, and $R_3$ in the formula (II) or (III) described above is a methoxy group, the absorption region of the photoresist composition containing the compound represented by the formula to actinic rays such as ultraviolet rays is shifted to a long wavelength side, whereby the exposure sensitivity of the photoresist composition is preferably improved. Further, when at least one of $R_4$ and $R_5$ in the formula (II) or (III) is a nitro group, the generation efficiency of an amine at the irradiation with actinic rays is increased. Also, $R_6$ in the formula (II) or (III) is a hydrogen atom or a lower alkyl group having from 1 to 6 carbon atoms, and in particular, when $R_6$ is a methyl group or an ethyl group, the generation efficiency of amine at the irradiation with actinic rays is preferably more increased.

Such carbamate derivatives represented by the formulae (II) and (III) can be synthesized by the methods described in J. F. Cameron and J. M. J. Frechet, *Journal of the Americal Chemical Society*, 1991, 113, 4303 and G. Ciamician and P. Silber, *Ber.*, 1901, 34, 2040.

The monovalent amine residue represented by X in the formula (II) makes carbamate bonding, and primary amines and secondary amines can be used as the amine residue. Such amines are preferably amines which have sufficiently high basicity, are solid or liquid at normal temperature and have high boiling point so that the amines are difficult to volatilize off at heating after exposure. Examples of the amines are cyclohexylamine, piperidine, 2,6-dimethylpiperidine, quinoline and the derivatives thereof, aniline and the derivatives thereof, imidazole and the derivatives thereof, etc.

On the other hand, the divalent amine residue represented by Y in the formula (III) makes carbamate bonding, and primary amines and secondary amines can be used as the amine residue. Such amines are preferably amines which have high boiling point and are solid or liquid at normal temperature, similar to the above-described amines. Examples of the amines are hexamethylenediamine, p-xylenediamine, p-phenylenediamine, m-phenylenediamine, 4,4'-diaminodiphenyl ether, 3,4'-diaminodiphenyl ether, 2,4'-diaminodiphenyl ether, 3,3'-diaminodiphenyl ether, 4,4'-diaminodiphenylsulfone, 3,4'-diaminodiphenylsulfone, 3,3'-diaminodiphenylsulfone, 4,4'-diaminodiphenyl sulfide, 3,4'-diaminodiphenyl sulfide, 3,3'-diaminodiphenyl sulfide, 3,3'-diaminobenzophenone, 3,4'-diaminobenzophenone, 4,4'-diaminobenzophenone, 4,4'-diaminodiphenylpropane, 3,4'-diaminodiphenylpropane, 3,3'-diaminodiphenylpropane, 4,4'-diaminodiphenylhexafluoropropane, 3,4'-diaminodiphenylhexafluoropropane, 3,3'-diaminodiphenylhexafluoropropane, bis[4-(3-diaminophenoxy)phenyl]methane, bis[4-(4-aminophenoxy)phenyl]methane, 2,2-bis[4-(3-aminophenoxy)phenyl]propane, 2,2-bis[4-(4-aminophenoxy)phenyl]propane, 2,2-bis[4-(3-aminophenoxy)phenyl] hexafluoropropane, 2,2-bis[4-(4-aminophenoxy)phenyl] hexafluoropropane, 1,3-bis(3-aminophenoxy)benzene, 4,4'-bis(4-aminophenoxy)biphenyl, bis[4-(3-aminophenoxy)phenyl]sulfone, bis[4-(4-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, etc.

Particularly preferred compounds in the carbamate derivatives are compounds having following structures [PBG-1], [PBG-2], [PBG-3], and [PBG-4].

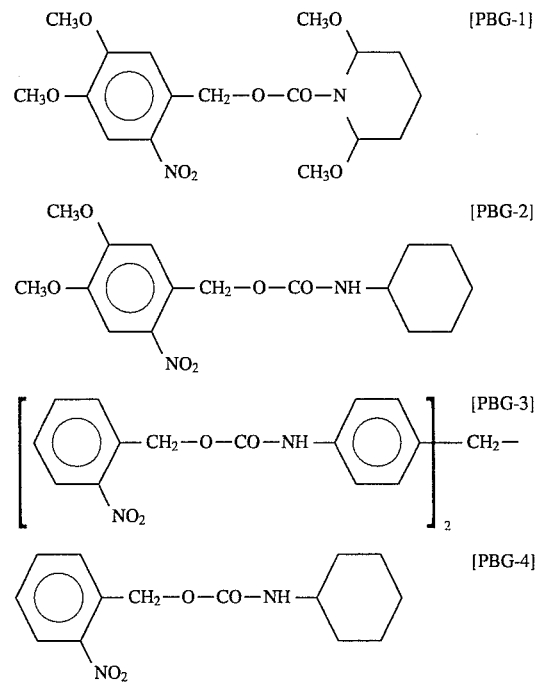

The heat-resistant photoresist composition of the present invention is characterized in that the resin composition having the structural unit represented by the formula (I) described above contains a compound generating a base such as an amine by irradiation with actinic rays, and a negative type pattern is formed by exposing and developing the layer of the heat-resistant photoresist composition. Also, if necessary, the heat-resistant photoresist composition can be compounded with conventional sensitizers.

The carbamate derivative is compounded with the resin component having the carbodiimide unit represented by the formula (I) in an molecule thereof in the amount of from 0.001 to 100 parts by weight, and preferably from 0.1 to 50 parts by weight, per 100 parts by weight of the resin component. That is, in the present invention, even when the amount of the carbamate derivative is relatively small, the sufficient effect is obtained. If the compounding amount of the carbamate derivative is less than 0.001 part by weight, the exposure sensitivity of the photoresist composition is lowered, and if the compounding amount thereof is over 100 parts by weight, when a high-temperature heat treatment is applied to the layer of the photoresist composition after forming a negative type pattern, the residual layer thickness ratio is reduced and the mechanical strength of the photoresist composition layer is lowered, which give bad influences on the properties of the photoresist composition layer.

A method of forming a negative type pattern using the heat-resistant photoresist composition of the present invention is specifically described below.

First, a photosensitive liquid is prepared by compounding the resin component (polycarbodiimide) synthesized as described above with a photobase generator such as the carbamate derivative. In this case, organic solvents such as N-methyl-2-pyrrolidone, N,N-dimethylacetamide, N,N-dimethylformamide, 1,3-dimethyl-2-imidazolidinone, dimethyl sulfoxide, dimethyl sulfide, dimethylsulfone, tetramethylurea, diglyme, triglyme, tetrahydrofuran, dioxane, cyclohexanone, toluene, xylene, halogenated hydrocarbon solvents (methylene chloride, chloroform, carbon tetrachloride, etc.), etc., can be used as a diluting solvent. Those can be used alone or as mixtures thereof.

There is no particular restriction on the amount of the organic solvent used, but the solution viscosity in preparing the photosensitive liquid can be controlled by controlling the amount of the organic solvent used, and thus the viscosity of the photosensitive liquid can be controlled to a viscosity suitable for coating. The amount of the organic solvent used is generally from 1 to 100 times, and preferably from 2 to 50 times, the total amount of the resin component and the photobase generator.

The photosensitive liquid is coated on the surface of a substrate and dried such that the dry thickness of the coated layer becomes from 0.1 to 50 μm, and preferably from 1 to 25 μm.

Examples of the substrate which can be used are a rigid substrate such as a silicon wafer, a glass plate, a copper plate, an aluminum plate, a steel plate, a ceramic plate, etc., and a flexible substrate such as a polyimide film, a polyester film, a copper foil, an aluminum foil, a stainless steel foil, etc. In coating the substrate with the photosensitive liquid, the surface of the substrate can previously be undercoated with a silane coupling agent, a titanate coupling agent, etc., to improve the adhesive property of the substrate.

The photosensitive layer formed by coating the photosensitive liquid on the substrate followed by drying is usually exposed by irradiating the photosensitive layer with actinic rays via a photo mask. After exposure, for further improving the difference in solubility between the exposed portions and the unexposed portions, the photosensitive layer thus exposed is, if necessary, heat-treated, whereby the crosslinking reaction of the exposed portions can be proceeded.

As actinic rays used for the irradiation, it is preferred from the point of the amount of the irradiation energy to use ultraviolet rays emitted from a mercury lamp or excimer laser, but visible light, electron rays, γ-rays, etc., can be used. Since the amount of the irradiation energy differs according the kind and the compounding amount of the photobase generator compounded in the photoresist composition of the present invention, the amount thereof cannot be generally determined. However, even a low irradiation energy amount of, for example, from 0.01 to 5,000 mJ/cm$^2$, and preferably from 0.1 to 500 mJ/m$^2$, can be used. In the present invention, even in the case of a relatively small irradiation energy amount, the photosensitive layer shows a sufficient photosensitivity.

The exposed photosensitive layer is then subjected to a development process using a dipping method or a spray method to remove the unirradiated portions. In this case, there is no particular restriction on the developer if the developer can completely dissolve off the unirradiated portions of the photosensitive layer thus exposed in an appropriate period of time. Examples of the developer which can be used are an organic solvent such as N-methyl-2-pyrrolidone, N,N-dimethylacetamide, N,N-dimethylformamide, 1,3-dimethyl-2-imidazolidinone, dimethyl sulfoxide, dimethyl sulfide, dimethylsulfone, tetramethylurea, diglyme, triglyme, tetrahydrofuran, dioxane, cyclohexane, toluene, xylene, isoamyl acetate, dimethylammonium, halogenated hydrocarbons, etc.; an inorganic alkaline aqueous solution of sodium hydroxide, potassium hydroxide, etc.; and an organic alkaline aqueous solution of propylamine, butylamine, monoethanolamine, tetramethylammonium hydroxide, choline, etc. Those can be used alone or as mixtures of them. Those alkaline aqueous solutions can, if necessary, contain an alcohol or a surface active agent.

After applying the development process, the photosensitive layer thus developed is washed with a rinse liquid, whereby a negative-type image pattern mainly composed of the resin component having a carbodiimide unit in the molecule can be obtained. Alcohols such as methanol, ethanol, isopropanol, etc., or water, etc., can be used as the rinse liquid.

As described above, since the heat-resistant photoresist composition of the present invention uses the specific resin component having the carbodiimide unit in the molecule and also uses a compound (photodecomposable base generator) inducing a basic compound by irradiation with actinic rays, the photoresist composition shows a sufficient sensitivity even in the case of a low irradiation energy amount and also has the excellent effects that the transparency, the residual layer thickness ratio, the flexibility, and the resolving power of the pattern obtained are excellent as compared with conventional photoresist compositions.

The present invention is described in more detail by the following examples, wherein all parts, unless otherwise indicated, are by weight.

Synthesis Example 1

To 500 g of toluene was added 100 g of tolylene diisocyanate together with 0.58 g of 3-methyl-1-phenylphosphorene-1-oxide as a carbodiimidation catalyst, and the reaction was carried out at 100° C. for 6 hours to synthesize a solution of polycarbodiimide A.

Synthesis Example 2

To 500 g of tetrahydrofuran was added 100 g of 4,4'-diphenylmethane diisocyanate together with 0.58 g of 3-methyl-1-phenylphosphorene-1-oxide as a carbodiimidation catalyst and the reaction was carried out at 100° C. for 6 hours to synthesize polycarbodiimide B.

EXAMPLE 1

To the solution of the polycarbodiimide A obtained in Synthesis Example 1 was added the compound PBG-1 described above as a photodecomposable base generator in an amount of 10 parts per 100 parts of the polycarbodiimide resin component, the resulting mixture was uniformly mixed with stirring, and insoluble matters were removed by filtration to obtain a solution (photosensitive liquid) of the heat-resistant photoresist composition of the present invention.

The photosensitive liquid thus prepared was spin-coated on a silicone wafer and dried to form a photosensitive layer having a thickness of 3 μm.

The photosensitive layer was exposed through a glass mask by irradiating the layer with actinic rays having a wavelength of 365 nm emitted from a super high-pressure mercury lamp of 250 W having a glass filter covered thereon. After exposure, the photosensitive layer was post-heated at 120° C. for 5 minutes, developed with toluene heated to 40° C. as a developer for one minute, and then rinsed with 2-propanol to obtain a negative-type sharp pattern composed of the light-irradiated portions only remaining on the silicone wafer.

The photosensitive layer had a sensitivity of 50 mJ/cm$^2$ and showed a resolving power (aspect ratio) of 1.12, that is, the photosensitive layer had a very high sensitivity and showed a very high resolving power. Further, the light transmittance of the pattern thus formed at 400 nm was 75%, which showed the pattern having a transparency. When the pattern was heat-treated at 260° C. for one hour, the residual layer thickness ratio was 90%, and the extent of the heat shrinkage thereof was less.

EXAMPLE 2

By following the same procedure as in Example 1 except that 7.5 parts of the compound PBG-2 described above was used in place of 10 parts of the compound PBG-1 as the photo-decomposable base generator used in Example 1, the heat-resistant photoresist composition of the present invention was prepared, and a negative-type pattern was formed in the same manner as in Example 1.

The photosensitive layer thus obtained had a sensitivity of 60 mJ/cm$^2$ and showed a resolving power (aspect ratio) of 0.92, that is, the photosensitive layer had a very high sensitivity and showed a very high resolving power. Further, the light transmittance of the pattern at 400 nm was 73%, which showed the pattern having a transparency. When the pattern was heat-treated at 280° C. for one hour, the residual layer thickness ratio was 87%, and the extent of the heat shrinkage thereof was less.

EXAMPLE 3

By following the same procedure as in Example 1 except that 6.4 parts of the compound PBG-3 described above was used in place of 10 parts of the compound PBG-1 as the photodecomposable base generator used in Example 1, the heat-resistant photoresist composition of the present invention was prepared and a negative-type pattern was prepared in the same manner as in Example 1.

The photosensitive layer thus obtained had a sensitivity of 40 mJ/m$^2$ and showed a resolving power (aspect ratio) of 0.86, that is the photosensitive layer had a very high sensitivity and showed a very high resolving power. Further, the light transmittance of the pattern at 400 nm was 78%, which showed the pattern having a transparency. When the pattern was heat-treated at 280° C. for one hour, the residual layer thickness ratio was 92% and the extent of the heat shrinkage thereof was less.

EXAMPLE 4

By following the same procedure as in Example 1 except that the solution of the polycarbodiimide B obtained in Synthesis Example 2 was used and also N-methyl-2-pyrrolidone was used as the developer, the heat-resistant photoresist composition of the present invention was prepared, and a negative-type pattern was prepared in the same manner as in Example 1.

The photosensitive layer thus obtained had a sensitivity of 70 mJ/m$^2$ and showed a resolving power (aspect ratio) of 0.76, that is, the photosensitive layer had a very high sensitivity and showed a very high resolving power. Further, the light transmittance of the pattern at 400 nm was 70%, which showed the pattern having a transparency. When the pattern was heat-treated at 280° C. for one hour, the residual layer thickness ratio was 83% and the extent of the heat shrinkage thereof was less.

Comparative Example 1

By following the same procedure as in Example 1 except that the compound PBG-1 as the photodecomposable base generator was not used, a photosensitive layer was formed and the formation of a negative-type pattern was tried in the same manner as in Example 1.

However, the photosensitive layer was wholly dissolved at development, and a negative-type pattern could not obtained. Further, even when the irradiation amount of the actinic rays was increased to 500 mJ/cm$^2$ the solubility at development was not changed and a negative-type pattern could not be obtained.

Comparative Example 2

By following the same procedure as in Example 1 except that 20 parts of nifedipine was used in place of the compound PBG-1 used as the photodecomposable base generator in Example 1, a photosensitive layer was prepared and the formation of a pattern was tried.

However, the photosensitive layer was wholly dissolved in toluene at development, and a pattern could not be obtained. Further, even when the irradiation amount of the actinic rays was increased to 500 mJ/cm$^2$, the exposed portions of the photosensitive layer were dissolved slightly faster than the unexposed portions to cause a difference in solubility between those portions, but a clear pattern (positive-type pattern) could not be obtained.

Comparative Example 3

By following the same procedure as in Example 1 except that 20 parts of 2,6-di(p-azidobenzal)-4-methylcyclohexane was used in place of the compound PBG-1 used as the photodecomposable base generator in Example 1, a photosensitive layer was prepared and the formation of a pattern was tried.

A pattern having an aspect ratio of 0.4 could be formed at a sensitivity of 200 mJ/cm$^2$, but the light transmittance of the pattern at 400 nm was 15% and the pattern was severely colored. When the pattern was them heat-treated at 260° C. for one hour, the residual layer thickness ratio thereof was 78% and the surface of the coated layer was partially cracked by curing shrinkage.

While the invention has been described in detail and with reference to specific embodiments thereof, it will be apparent to one skilled in the art that various changes and modifications can be made therein without departing from the spirit and scope thereof.

What is claimed is:

1. A heat-resistant photoresist composition comprising a resin component having a carbodiimide unit represented by the following formula (I), and a compound capable of inducing a basic compound by irradiation with actinic rays,

$$\text{--}[\text{R--N=C=N}]\text{--} \qquad (I)$$

wherein R represents a divalent organic group.

2. The heat-resistant photoresist composition as claimed in claim 1 wherein the resin component is a polycarbodiimide compound.

3. The heat-resistant photoresist composition as claimed in claim 2, wherein the polycarbodiimide compound has a number average molecular weight of from 300 to 300,000.

4. The heat-resistant photoresist composition as claimed in claim 1, wherein the resin component contains carbodiimide units in an amount of from 20 to 100 mol %.

5. The heat-resistant photoresist composition as claimed in claim 1, wherein the compound capable of inducing a basic compound by irradiation with actinic rays is at least one selected from the group consisting of a carbamate derivative represented by the following formula (II) and a carbamate derivative represented by the following formula (III);

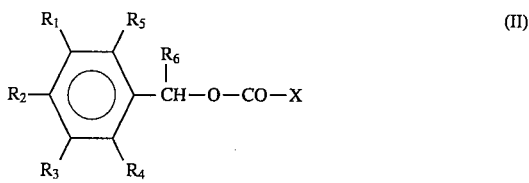
(II)

wherein $R_1$, $R_2$, and $R_3$ each represents a hydrogen atom or a methoxy group; $R_4$ and $R_5$ each represents a hydrogen atom or a nitro group and at least one of $R_4$ and $R_5$ is a nitro group; $R_6$ represents a hydrogen atom or a lower alkyl group having from 1 to 6 carbon atoms; and X represents a monovalent amine residue for carbamate bonding;

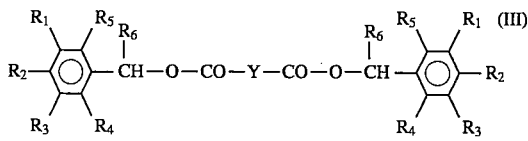
(III)

wherein $R_1$, $R_2$, and $R_3$ each represents a hydrogen atom or a methoxy group; $R_4$ and $R_5$ each represents a hydrogen atom or a nitro group and at least one of $R_4$ and $R_5$ is a nitro group; $R_6$ represents a hydrogen atom or a lower alkyl group having from 1 to 6 carbon atoms; and Y represents a divalent amine residue for dicarbamate bonding.

6. The heat-resistant photoresist composition as claimed in claim 5, wherein the carbamate derivative consists of an amount of from 0.001 per 100 parts by weight to 100 parts by weight of the resin component.

7. The heat-resisting photoresist composition as claimed in claim 1, wherein the actinic rays are ultraviolet rays.

* * * * *